(12) United States Patent
Kuwabara et al.

(10) Patent No.: US 6,600,234 B2
(45) Date of Patent: *Jul. 29, 2003

(54) MOUNTING STRUCTURE HAVING COLUMNAR ELECTRODES AND A SEALING FILM

(75) Inventors: Osamu Kuwabara, Tokyo (JP); Takeshi Wakabayashi, Sayama (JP); Ichiro Mihara, Tachikawa (JP)

(73) Assignee: Casio Computer Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/494,916

(22) Filed: Jan. 31, 2000

(65) Prior Publication Data

US 2002/0000658 A1 Jan. 3, 2002

(30) Foreign Application Priority Data

Feb. 3, 1999 (JP) ............................................. 11-025934

(51) Int. Cl.[7] ........................... H01L 23/28; H01L 23/29
(52) U.S. Cl. ........................ 257/790; 257/787; 257/788; 257/789; 257/795; 257/737; 257/738; 257/780
(58) Field of Search ................................ 257/787, 789, 257/790, 795, 788, 783, 737, 738

(56) References Cited

U.S. PATENT DOCUMENTS

| | | | |
|---|---|---|---|
| 5,641,997 A | * 6/1997 | Ohta et al. ................... | 257/788 |
| 5,880,530 A | * 3/1999 | Mashimoto et al. ......... | 257/783 |
| 5,908,317 A | * 6/1999 | Heo ............................. | 438/617 |
| 5,959,363 A | * 9/1999 | Yamada et al. .............. | 257/787 |
| 5,981,313 A | * 11/1999 | Tanaka ......................... | 438/118 |
| 6,107,164 A | * 8/2000 | Ohuchi ......................... | 438/465 |
| 6,121,689 A | * 9/2000 | Capote et al. ................ | 257/783 |
| 6,204,563 B1 | * 3/2001 | Ohuchi et al. ............... | 257/778 |
| 6,335,571 B1 | * 1/2002 | Capote et al. ................ | 257/787 |

FOREIGN PATENT DOCUMENTS

| | | | | |
|---|---|---|---|---|
| JP | 360094744 | * | 5/1985 | .................... 23/28 |
| JP | 1-173733 | | 7/1989 | |
| JP | 3-293740 | | 12/1991 | |

* cited by examiner

*Primary Examiner*—Tom Thomas
*Assistant Examiner*—Nitin Parekh
(74) *Attorney, Agent, or Firm*—Frishauf, Holtz, Goodman & Chick, P.C.

(57) ABSTRACT

A semiconductor device includes a semiconductor substrate having bump electrodes and a sealing film formed thereon, the sealing film having laminated layers. The sealing film interposed between adjacent bump electrodes is prepared by laminating a protective film and each layer of the sealing film on the lower surface of the base film, on the bump electrodes, followed by allowing the bump electrodes to project through the sealing film under pressure and heat. The thickness of the sealing film is smaller than the height of the bump electrode, and thus the bump electrode projects through the sealing film. Particles for lowering the thermal expansion coefficient are dispersed in the sealing film to allow the sealing layers to exhibit a thermal expansion coefficient differing in its thickness direction such that the thermal expansion coefficient in the layer which is close to the semiconductor substrate is close to that of the semiconductor substrate.

9 Claims, 10 Drawing Sheets

MOUNTING STRUCTURE HAVING COLUMNAR ELECTRODES AND A SEALING FILM

BACKGROUND OF THE INVENTION

The present invention relates to a semiconductor device having bump electrodes and a method of manufacturing the same.

A mounting technology called the face down bonding system is employed in some cases in mounting a semiconductor device consisting of a single semiconductor chip or a semiconductor device called CSP (Chip Size Package) to a circuit substrate. In such a semiconductor device, bump electrodes for connection to, for example, another circuit substrate are mounted directly to a semiconductor substrate or mounted to a semiconductor substrate with an intermediate substrate (interposer) interposed therebetween.

It is customary to manufacture such a semiconductor device by the manufacturing process shown in FIGS. 11A and 11B. Specifically, a plurality of bump electrodes 3 are formed on a semiconductor substrate 2 such as a silicon substrate of a wafer state, as shown in FIG. 11A. Then, a sealing film 4 made of an epoxy resin is formed by a screen printing method, a potting method, a transfer molding method or the like such that the thickness of the sealing film 4 is somewhat larger than the height of the bump electrode 3. Therefore, under this state, the upper surface of the bump electrode 3 is covered with the sealing film 4. Then, the upper regions of the sealing film 4 are polished appropriately so as to permit the upper surfaces of the bump electrodes 3 to be exposed to the outside, as shown in FIG. 11B. After the polishing step, the silicon wafer is separated into individual semiconductor chips in a dicing step (not shown) so as to obtain a semiconductor device 1 provided with bump electrodes.

Solder bumps are formed on the bump electrodes of the semiconductor device 1 thus prepared and these solder bumps are mounted to connection pads of another circuit substrate by a face down bonding method. FIG. 12 exemplifies the mounted structure thus prepared. The semiconductor substrate 1 comprises a planar and rectangular silicon substrate 2, and a plurality of connection pads 5 for connection to outer devices are formed on the lower surface of the silicon substrate 2. An insulating film 6 is formed on the entire lower surfaces of the silicon substrate 2 and the connection pads 5 except the central portions of the connection pads 5 such that the central portions of the connection pads 5 are exposed to the outside via the open portions formed in the insulating film 6. A wiring substrate metal layer 8 is formed to extend from the exposed lower surface of the connection pad 5 to the lower surface of the insulating film 6. In this case, the wiring substrate metal layer 8 consists of a connecting portion 8a positioned below the connection pad 5, a connecting pad portion 8b positioned in a predetermined portion of the lower surface of the insulating film 6, and a draw wiring 8c formed between the connecting portion and the connecting pad. The bump electrode 3 consisting of copper, gold, etc. is formed on the lower surface of the connecting pad portion 8b. Further, the sealing film 4 consisting of, for example, an epoxy resin is formed on the lower surface of the insulating film 6 and the wiring 8 excluding the bump electrode 3. The solder bump 9 is formed on the lower surface of the bump electrode 3. It should be noted that the solder bumps 9 of the semiconductor device 1 are bonded to connection pads 11 formed on the upper surface of a circuit substrate 10 consisting of, for example, a glass epoxy by a face down bonding so as to mount the semiconductor device 1 to the circuit substrate 10.

It should be noted that silicon constituting the silicon substrate 2, the sealing resin constituting the sealing film 4 and the glass epoxy constituting the circuit substrate 10 differ from each other in thermal expansion coefficient. Specifically, the thermal expansion coefficient is 2 to 3 ppm/° C. for silicon, 10 to 15 ppm/° C. for the sealing resin and about 15 ppm/° C. for the glass epoxy. What should be noted is that the sealing film 4 and the circuit substrate 10 are close to each other in the thermal expansion coefficient. On the other hand, a difference in the thermal expansion coefficient between the sealing film 4 and the silicon substrate 2 is relatively large. As a result, a relatively large stress derived from the difference in thermal expansion coefficient is generated between the silicon substrate 2 and the sealing film 4 by the change in temperature in the case where the semiconductor device 1 is bonded to the circuit substrate 10 via the solder bumps 9 as shown in FIG. 12. What should be noted in this connection is that the thickness of the insulating film 4 is equal to the height of the bump electrode 3. It follows that the bump electrode 3 is incapable of being deformed so as to absorb the stress generated between the silicon substrate 2 and the sealing film 4, leading to the possibility that a crack may be formed in the bonding portion between the bump electrode 3 and the solder bump 9 or in the bonding portion between the solder bump 9 and connection pad 11. The formation of such a crack brings about a problem that it is difficult to ensure a satisfactory bonding.

BRIEF SUMMARY OF THE INVENTION

An object of the present invention is to provide a semiconductor device comprising bump electrodes formed on a semiconductor substrate and a sealing film, the semiconductor device being mounted to another circuit substrate via the bump electrodes and having a structure for absorbing the stress derived from a difference in thermal expansion coefficient between the semiconductor substrate the circuit substrate and between the semiconductor substrate and the sealing film so as to suppress occurrence of a defective bonding, and a method of manufacturing the particular semiconductor device.

For achieving the object, a first semiconductor device of the present invention is featured in that a sealing film comprising of at least two layers having the thermal expansion coefficients controlled appropriately is formed between adjacent bump electrodes on the semiconductor substrate, and that the thickness of each layer of the sealing film is smaller than the height of the bump electrode. Where the thickness of the entire sealing film is made smaller than the height of the bump electrode, the bump electrode projects from the sealing film, and the projecting portion of the bump electrode absorbs the stress derived from the difference in thermal expansion coefficient between the semiconductor substrate and the circuit substrate. A method of manufacturing the semiconductor device of the particular construction comprises the step of forming a laminate film consisting of a protective film formed on a lower surface of a base film and a sealing film formed on the protective film, the sealing film comprising of a plurality of layers, the step of disposing the laminate film thus formed on the bump electrodes, followed by heating under pressure the laminate film to permit the bump electrodes to extend through the sealing film; and the step of peeling off the base film and the protective film to permit the protective film to perform the function of a buffer member, thereby preventing the bump electrodes from being collapsed or damaged.

For achieving the object, a second semiconductor device of the present invention is featured in that the thermal expansion coefficient of the sealing film formed between adjacent bump electrodes on the semiconductor substrate is controlled to differ in its thickness direction such that the thermal expansion coefficient of the sealing film on the side of the semiconductor substrate is close to that of the semiconductor substrate and the thermal expansion coefficient of the sealing film on the side of the circuit substrate is close to that of the circuit substrate. The particular construction permits absorbing the stress derived from a difference in thermal expansion coefficient between the semiconductor substrate and the sealing film. A method of manufacturing a semiconductor device of the particular construction comprises the step of mixing particles for lowering the thermal expansion coefficient in forming a sealing film by curing, the volume ratio of the particles being controlled appropriately in a thickness direction of the sealing film so as to permit the sealing film to exhibit thermal expansion coefficients differing from each other in thickness direction of the sealing film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Semiconductor devices of the present invention and methods of manufacturing the particular semiconductor devices will now be described in detail with reference to the accompanying drawings.

Figure 1:
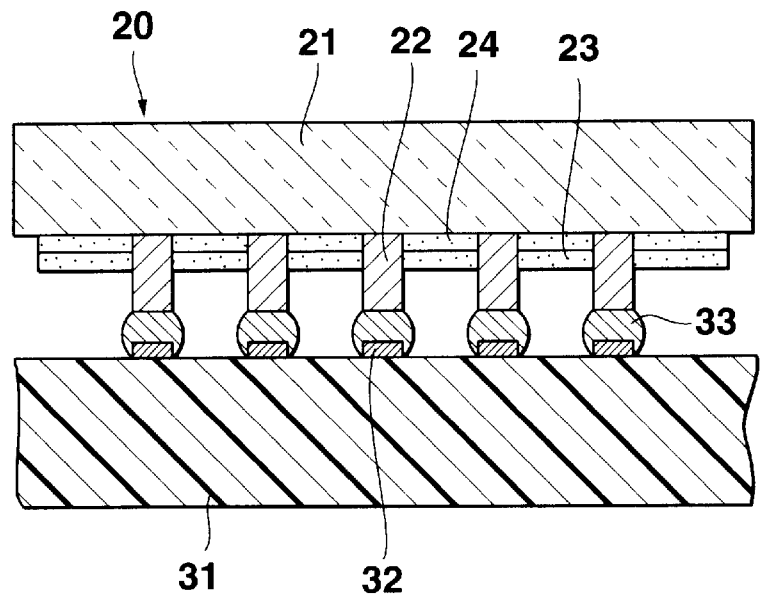
FIG. 1 is a cross sectional view showing a mounting structure in which a semiconductor device according to a first embodiment of the present invention is mounted to another circuit substrate via bump electrodes.
Figure 2:
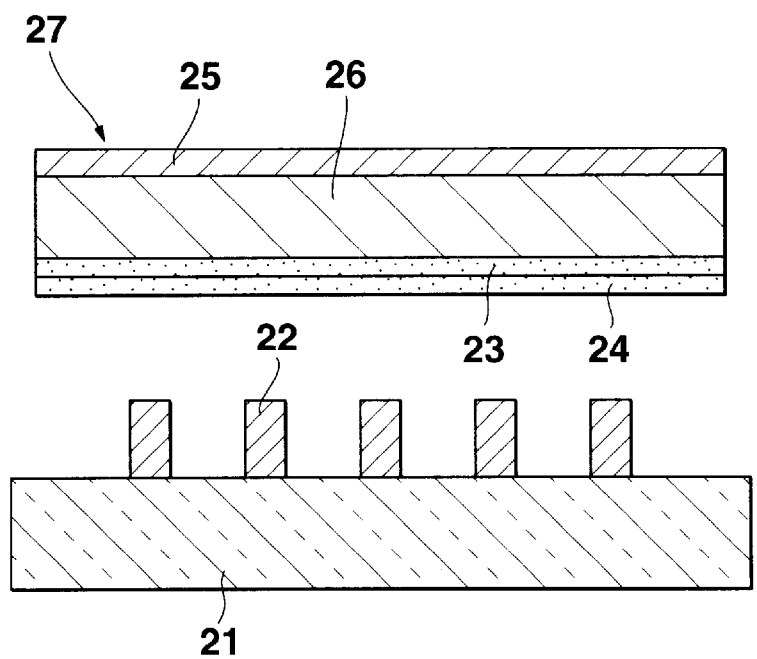
FIG. 2 is a cross sectional view showing a semiconductor substrate having bump electrodes mounted thereto and the step of forming a laminate film in a manufacturing process according to the first embodiment of the present invention.

Specifically, FIG. 1 is a cross sectional view showing a mounting structure in which a semiconductor device according to a first embodiment of the present invention is mounted to another circuit substrate via bump electrodes. In this embodiment, a semiconductor device 20 includes a plurality of bump electrodes 22 formed on a semiconductor substrated 21. On the other hand, a plurality of connection pads 32 are formed in predetermined portions on an upper surface of a circuit substrate 31. As shown in the figure, the projecting edge portions of the bump electrodes 22 are bonded to solder bumps 33 formed in advance on the connection pads 32 so as to permit the semiconductor device 20 to be mounted to the circuit substrate 31. It should be noted that sealing films 23, 24 are formed in regions between adjacent bump electrodes 22 of the semiconductor device 20. Each of these sealing films 23 and 24 is formed of resin such as an epoxy series resin, a biphenyl series resin, a phenolic resin, a silicone resin or a polyester resin. What should be noted is that particles for lowering the thermal expansion coefficient such as silica particles are dispersed in the resin. In this case, the sealing films 23 and 24 are made different from each other in the dispersed amount of the particles for lowering the thermal expansion coefficient and, thus, exhibit different characteristics. Specifically, the thermal expansion coefficient of the lower sealing film 24 is made smaller than that of the upper sealing film 23. As a result, the thermal expansion coefficient of the lower sealing film 24 is close to that of the silicon substrate 21. Likewise, the thermal expansion coefficient of the upper sealing film 23 is close to that of the bump electrode 22. Incidentally, it is possible to disperse the particles for lowering the thermal expansion coefficient in only the lower sealing film 24. In other words, it is possible for the upper sealing film 23 to be formed of the resin alone. It should also be noted that the total thickness of these sealing films 23 and 24 imparted with the particular characteristics is smaller than the height of the bump electrode 22. Naturally, the bump electrode 22 projects through the sealing films 23, 24, and the projecting portion allows the bump electrode 22 to be easily swingable.

As a result, the stress derived from the difference in thermal expansion coefficient between the silicon substrate 21 and the circuit substrate 31 can be absorbed by the bump electrodes 22 in the temperature cycle test applied after the semiconductor device 20 is mounted to the circuit substrate 31. It should also be noted that, since the thermal expansion coefficient of the lower sealing film 24 is close to that of the silicon substrate 21 and the thermal expansion coefficient of the upper sealing film 23 is close to that of the bump electrode 22, it is possible to diminish the stress derived from the difference in thermal expansion coefficient between the lower sealing film 24 and the silicon substrate 21. In addition, the bump electrode 22 readily follows the movement of the upper sealing film 23 so as to suppress the defect occurrence.

FIGS. 2 to 5 are cross sectional views collectively showing the manufacturing process for manufacturing the semiconductor device according to the first embodiment of the present invention shown in FIG. 1.

In the first step, prepared are a silicon substrate 21 in a wafer state having a plurality of bump electrodes 22 formed thereon and a laminate film 27 constructed by a base film 25, a protective film 26 laminated on the lower surface of the base film 25, the upper sealing film 23 laminated on the lower surface of the protective film 26 and the lower sealing film 24 laminated on the lower surface of the upper sealing film 23. The base film 25 is formed of an engineering plastic material such as polyimide or PET (polyethylene terephthalate). The protective film 26 is formed of an urethane resin. Further, each of sealing films 23 and 24 is formed of resin such as an epoxy series resin, a biphenyl series resin, a phenolic resin, a silicone resin or a polyester resin, as described previously. What should be noted is that particles for lowering the thermal expansion coefficient such as silica particles are dispersed in the resin. In this case, the sealing films 23 and 24 are made different from each other in the dispersed amount of the particles for lowering the thermal expansion coefficient and, thus, exhibit different characteristics. Also, the total thickness of the sealing films 23 and 24 is made smaller than half the height of the bump electrode 22. Where, for example, the bump electrode 22 is about 150 μm high, the total thickness of the sealing films 23, 24 is set at about 50 to 70 μm. The thickness of the protective film 26 is determined to permit the total thickness of the protective film 26 and the sealing films 23, 24 to be somewhat larger than the height of the bump electrode 22. The protective film 26 and the sealing films 23, 24 can be laminated on the base film 25 by laminating the protective film 26 on the lower surface of the base film 25, followed by laminating the lower sealing film 24 on the lower surface of the protective film 26 and subsequently laminating the upper sealing film 23 on the lower surface of the lower sealing film 24. Alternatively, it is possible to coat the lower surface of the base film 25 with flowable materials, followed by curing the coated materials to form the protective film 26 and the sealing films 23, 24 in a laminated fashion.

Figure 3:
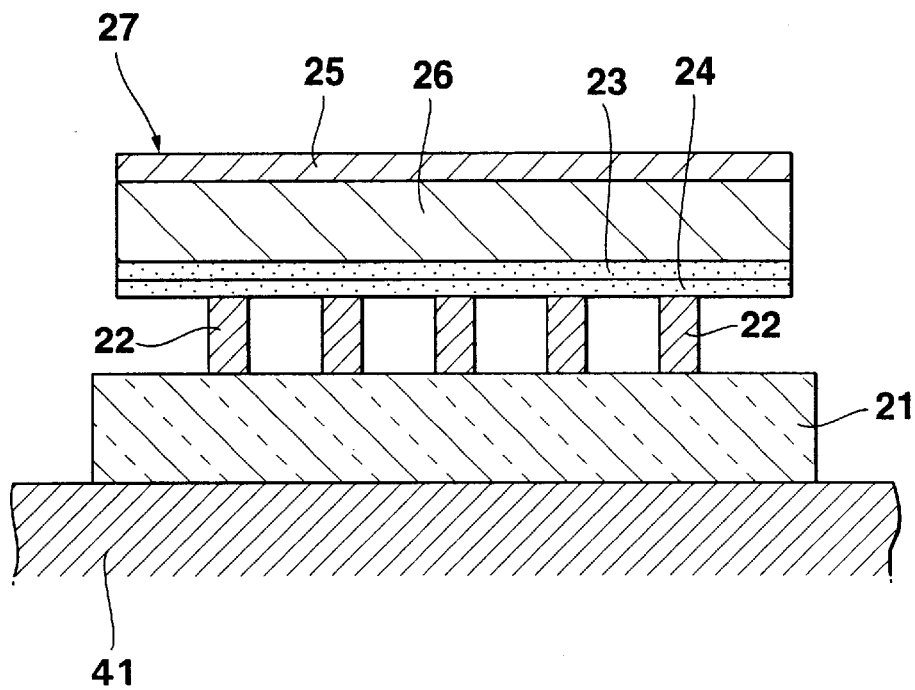
FIG. 3 is a cross sectional view showing the step of positioning a semiconductor device on a stage and disposing a laminate film on the bump electrodes in an aligned fashion in the manufacturing process according to the first embodiment of the present invention.

In the next step, the silicon substrate 21 is disposed on a desired portion of a stage 41, as shown in FIG. 3. Then, the laminate film 27 is mounted on the upper surfaces of the bump electrodes 22 in an aligned fashion such that the lower sealing film 24 is in direct contact with the upper surfaces of the bump electrodes 22.

Figure 4:
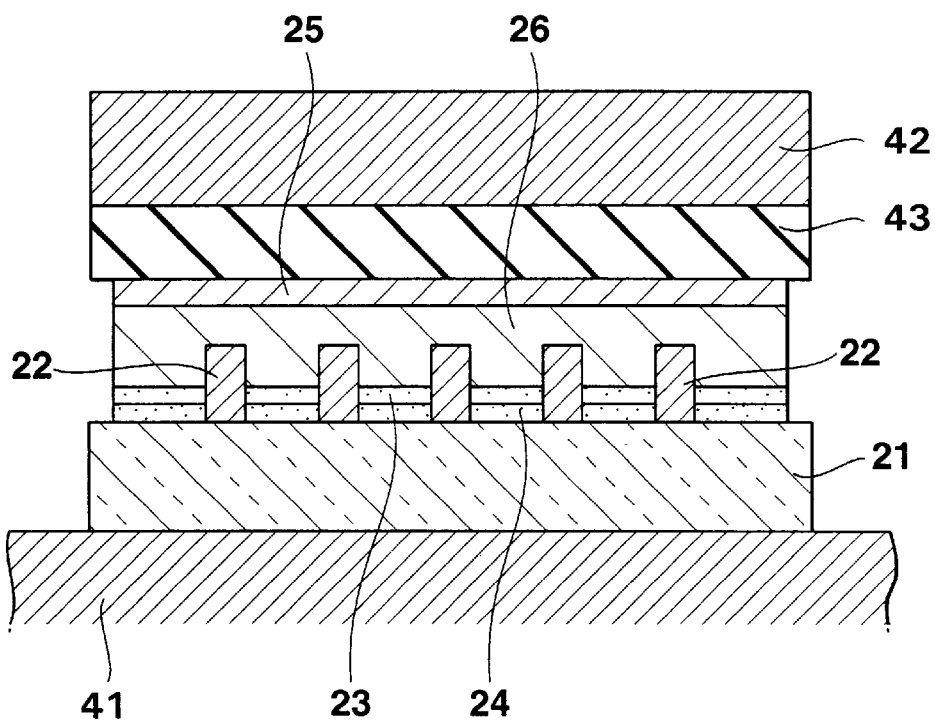
FIG. 4 is a cross sectional view showing the step of pressurizing under heat a sealing film between a hot plate and the stage to permit the bump electrodes to extend through the sealing film in the manufacturing process according to the first embodiment of the present invention.

Then, the laminate film 27 is pressurized on the side of the base film 25 by a heating-pressurizing member comprising a hot plate 42 and a heat resistant rubber plate 43 mounted to the lower surface of the hot plate 42, as shown in FIG. 4. At the same time, the stage 41 and the hot plate 42 are heated to provide a heating temperature of about 150° C. As a result, the protective film 26 and the sealing films 23, 24 are softened to permit the bump electrodes 22 to project through the lower sealing film 24 and the upper sealing film 23 and, thus, to be buried in the protective film 26. As described previously, the total thickness of the protective film 26 and the sealing films 23, 24 is larger than the height of the bump electrode 22. It follows that it is impossible for the upper surface of the bump electrode 22 to extend to reach the lower surface of the base film 25. In addition, the protective film 26 functions as a buffer member, with the result that the bump electrode 22 is not collapsed nor damaged. Further, the repulsive force of the protective film 26 permits the sealing films 23, 24 to be bonded without fail to the upper surface of the silicon substrate 21.

Figure 5:
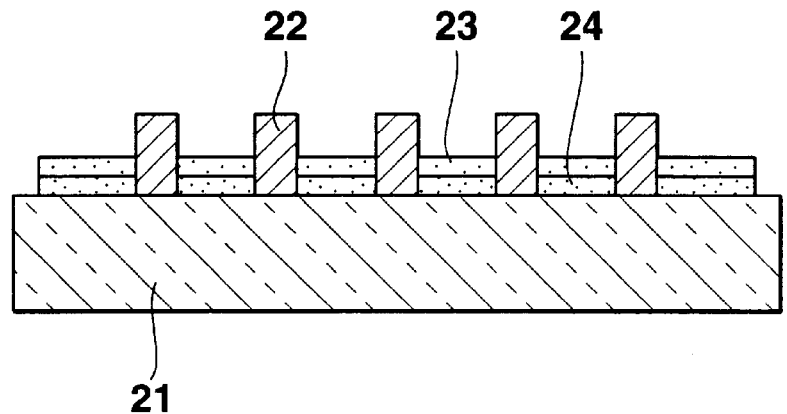
FIG. 5 is a cross sectional view showing the step of peeling off a base film and a protective film in the manufacturing process according to the first embodiment of the present invention.

In the next step, the hot plate 42, the heat-resistant rubber plate 43, and the stage 41 are removed so as to peel off the base film 25 and the protective 26. As a result, a substantially upper half portion of the bump electrode 22 is projected from the upper sealing film 23, as shown in FIG. 5. In this case, the base film 25 and the protective film 26 may be peeled off separately or simultaneously. If heating is applied appropriately, these films 25 and 26 can be peeled off easily, whether these films may be peeled off separately or simultaneously. Incidentally, the projecting length of the bump electrode 22 from the upper sealing layer 23 can be controlled as desired by controlling the total thickness of the sealing films 23 and 24.

Then, the sealing films 23 and 24 are cured within a thermal curing furnace (not shown), followed by separating the wafer into individual semiconductor chips by a dicing process (not shown) so as to obtain semiconductor devices 20 (semiconductor chips) provided with the bump electrode 22 and the sealing films 23, 24.

In the embodiment described above, the upper sealing film 23 is formed of resin mixed with particles for lowering the thermal expansion coefficient such as silica particles. Alternatively, the upper sealing film 23 may be formed of, for example, an epoxy resin mixed with an additive for lowering an elastic modulus such as a silicone oil. In this case, the elastic modulus of the upper sealing film 23 is diminished appropriately so as to permit the bump electrode 22 to be swingable more easily. Alternatively both medium such as particles far lowering the thermal expansion coefficient and medium for lowering an elastic modulus may be added in the sealing film 23, together.

Figure 6:
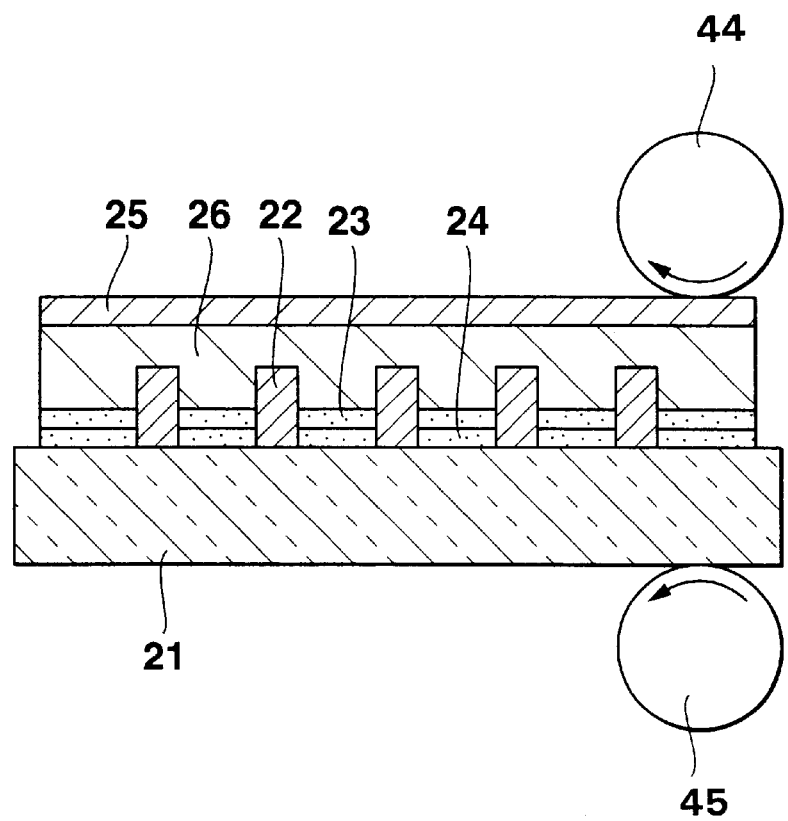
FIG. 6 is a cross sectional view showing the step of using a pressurizing heating roller in place of the pressurizing step under heat shown in FIG. 4 in the manufacturing process according to the first embodiment of the present invention.

Also, in the embodiment described above, it is possible to use a manufacturing process as shown in FIG. 6 in place of the pressurizing step under heat shown in FIG. 4. In the process shown in FIG. 6, the structure shown in FIG. 3, in which the lower sealing film 24 of the laminate film 27 is aligned on the upper surface of the plural bump electrodes 22, is interposed between a pair of pressurizing heating rollers 44 and 45. In this case, these rollers 44 and 45 are rotated in directions denoted by arrows in FIG. 6 so as to permit the particular structure to be moved from the right to the left in the drawing. The process shown in FIG. 6 makes it possible to carry out the pressurizing under heat continuously.

In the embodiment described above, a laminate structure comprising of the base film 25, the protective film 26, the upper sealing film 23 and the lower sealing film 24 is prepared in advance. Alternatively, these films 25, 26, 23 and 24 can be disposed successively on the bump electrodes 22 of the silicon substrate 21 for the pressurizing under heat.

Also, in the embodiment described above, the protective film 26 is formed of an urethane series resin. Alternatively, the protective film 26 can be formed by, for example, laminating a protective film on the lower surface of the base film, said protective film consisting of an adhesive (UV curing type adhesive) whose adhesive force to the sealing film is instantly lowered upon irradiation with an ultraviolet light (UV). In this case, the base film comprises any one of PVA (polyvinyl chloride), EVA (ethylenevinyl acetate copolymer), PO (polyolefin), etc. If an anchoring treatment is applied in advance to the lower surface of the base film, peeling does not take place between the base film and the protective film even if the base film is irradiated with an ultraviolet light, with the result that the base film and the protective film can be easily peeled off simultaneously from the sealing film. Incidentally, the base film, the protective film and the two sealing films can be formed of separate sheet materials.

Further, in the embodiment described above, the sealing film is of a double layer structure comprising the upper sealing film 23 and the lower sealing film 24. However, it is also possible for the sealing film to be of a single layer structure or to comprise three or more layers. In the case of employing a single layer structure, the sealing film can be formed of only any of the resins referred to previously. Also, where the sealing film is of, for example, a three-layer structure, the intermediate layer may be made intermediate between the lower layer and the upper layer in the thermal expansion coefficient and the elastic modulus.

Figure 7:
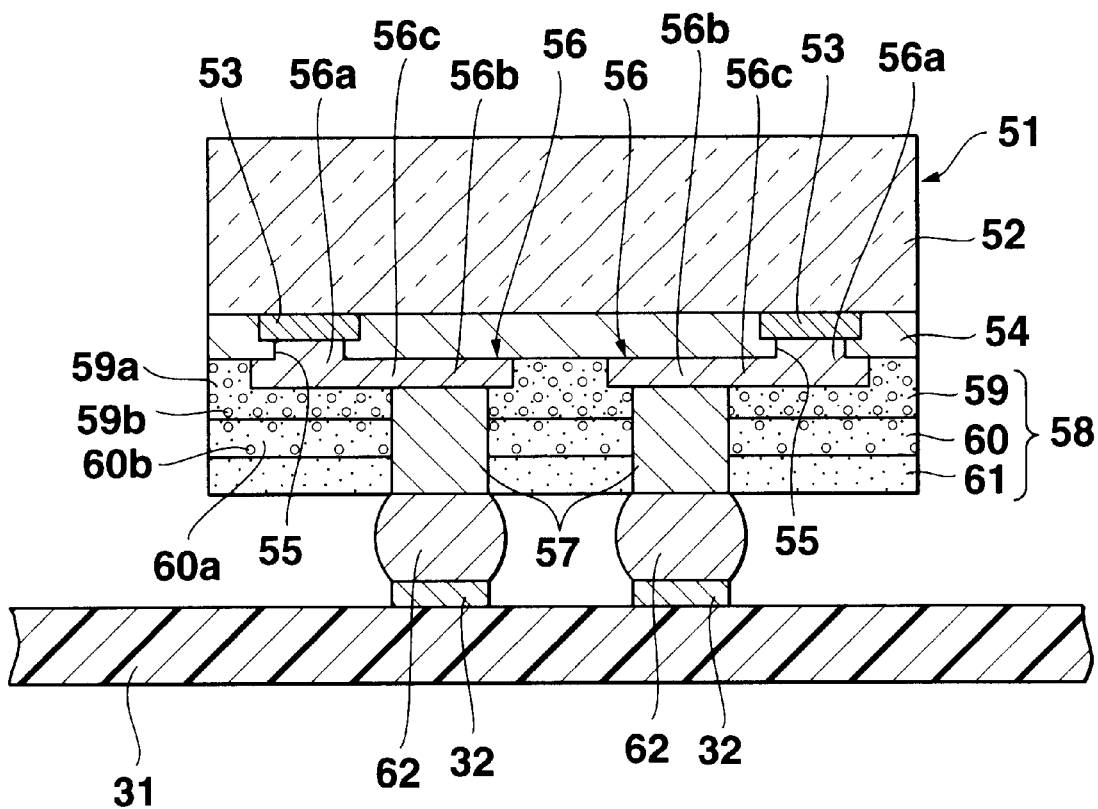
FIG. 7 is a cross sectional view showing a mounting structure in which a semiconductor device according to a second embodiment of the present invention is mounted to another circuit substrate via bump electrodes.

FIG. 7 is a cross sectional view showing the mounting structure of a semiconductor device 51 according to a second embodiment of the present invention. As shown in the drawing, the semiconductor device 51 comprises a planar and rectangular silicon substrate 52. A plurality of connection pads 53 are formed in the outer circumferential portion on the lower surface of the silicon substrate 52. An insulating film 54 is formed to cover the connection pads, except the central portions, and the entire lower surface of the silicon substrate 52 such that the central portions of the connection pads 53 are exposed to the outside through openings 55 formed in the insulating film 54. A wiring substrate metal layer 56 is formed to extend from the lower surface of the exposed connection pad 53 to the lower surface of the insulating film 54. The wiring substrate metal layer 56 includes a connecting portion 56a formed beneath the connection pad 53, a connecting pad portion 56b formed on the lower surface of the insulating film 54, and a draw wiring 56c interposed between the connecting portion 56a and the connection pad portion 56b. A plurality of bump electrodes 57 made of steel, gold, etc. are formed on the lower surfaces of the respective connection pad portions 56b. A sealing film 58 is formed on the lower surface of the insulating film 54 except the bump electrodes 57. The sealing film 58 is of a three-layer structure comprising a lower sealing film 59 in direct contact with the insulating film 54 and prepared by introducing silica particles 59b into an epoxy resin 59a, an intermediate sealing film 60 prepared by introducing silica particles 60b into an epoxy resin 60a, and an upper sealing film 61 consisting of an epoxy resin alone. The silica particles 59a, 60a serve to lower the thermal expansion coefficients of the lower and intermediate sealing films 59 and 60, respectively, and have the same particle diameter. The silica particle content of the epoxy resin 59a is higher than that of the epoxy resin 60a. As a result, the thermal expansion coefficient of the lower sealing film 59 is close to that of the silicon substrate 52, and the thermal expansion coefficient of the intermediate sealing film 60 is lower than that of the epoxy resin single body (upper sealing film 61) and higher than that of the lower sealing film 59. In other words, the thermal expansion coefficient of the intermediate sealing film 60 is intermediate between the thermal expansion coefficient of the lower sealing film 59 and the thermal expansion coefficient of the upper sealing film 61. Further, since the upper sealing film 61 consists of epoxy resin alone, the thermal expansion coefficient of the upper sealing film 61 is close to that of the material, e.g., glass epoxy, constituting a wiring substrate 31. A solder bump 62 is formed on the lower surface of the bump electrode 57. The solder bump 62 is connected by face down bonding to the connection pad 32 formed on the upper surface of the wiring substrate 31 so as to permit the semiconductor device 51 to be mounted to the wiring substrate 31.

To reiterate, in the mounting structure shown in FIG. 7, the sealing film 58 is of a three-layer structure comprising the lower sealing film 59 having a thermal expansion coefficient close to that of the silicon substrate 52, the intermediate sealing film 60 having a thermal expansion coefficient intermediate between the thermal expansion coefficient of the lower sealing film 59 and the thermal expansion coefficient of the upper sealing film 61, and the upper sealing film 61 having a thermal expansion coefficient close to that of the wiring substrate 31. It follows that, even if stress derived from a difference in thermal expansion coefficient between the silicon substrate 52 and the sealing film 58 is generated by changes in temperature, it is possible to diminish the stress derived from the difference in thermal expansion coefficient between the lower sealing film 59, which is positioned closest to the silicon substrate 52 among the three films comprising the sealing film 58, and the silicon substrate 52. As a result, crack occurrence can be suppressed at the joining portion between the bump electrode 57 and the solder bump 62 and at the joining portion between the solder bump 62 and the connection pad 32 so as to improve the reliability of the joining portions.

FIGS. 8A to 8E are cross sectional views collectively showing a method of manufacturing a semiconductor device according to the second embodiment of the present invention, shown in FIG. 7.

Figure 8A:
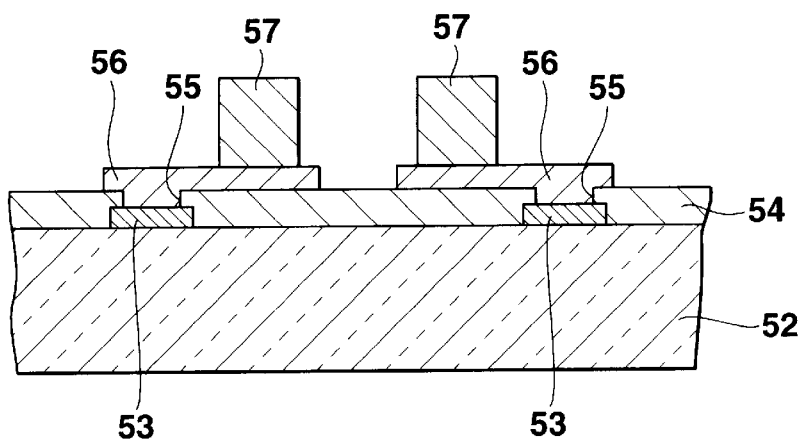
FIGS. 8A to 8E are cross sectional views collectively showing a manufacturing process according to the second embodiment of the present invention.

As shown in FIG. 8A, the connection pads 53 are formed on an upper surface of the silicon substrate 52 of a wafer state, followed by forming the insulating film 54 to cover the upper surface of the silicon substrate 52 and the connection pads 53 except the central portions such that the open portions 55 are formed in the insulating film 54. Then, the wiring substrate metal layer 56 is formed to extend from the exposed upper surface of the connection pad 53 to the upper surface of the insulating film 54. Further, the bump electrodes 57 are formed on the upper surface of the wiring substrate metal layer 56.

Figure 8B:
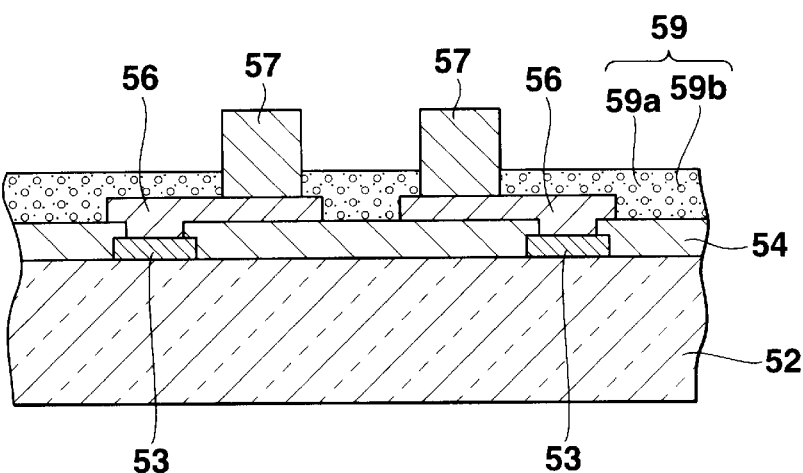
Figure 8C:
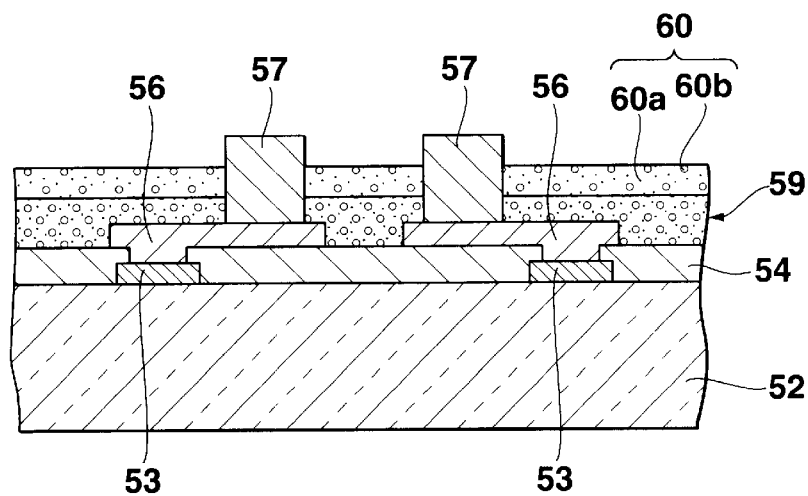
Figure 8D:
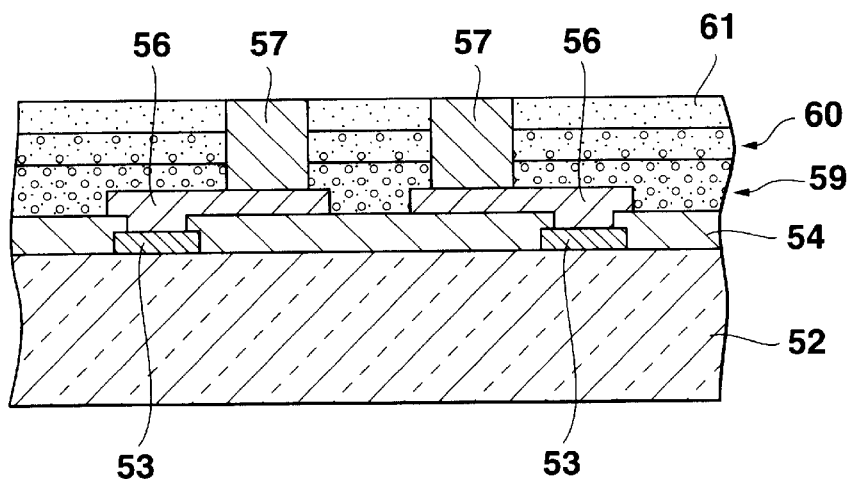

In the next step, the lower sealing film 59 is formed as shown in FIG. 8B by coating the upper surface of the insulating film 54 except the bump electrodes 57 with the epoxy resin 59a containing a relatively large amount of the silica particles 59b by a dispenser method, a spin coating method, etc., followed by curing the epoxy resin 59a. Then, the intermediate sealing film 60 is formed as shown in FIG. 8C by coating the upper surface of the lower sealing film 59 except the bump electrodes 57 with the epoxy resin 60a containing a relatively small amount of the silica particles 60b by a dispenser method, a spin coating method, etc., followed by curing the epoxy resin 60a. Further, the upper sealing film 61 is formed as shown in FIG. 8D by coating the upper surface of the intermediate sealing film 60 except the bump electrodes 57 with an epoxy resin by a dispenser method, a spin coating method, etc., followed by curing the epoxy resin. If the upper surface of the bump electrode 57 is covered with the lower sealing film 61 when formation of the lower sealing film 61, the surface region of the upper sealing film 61 is lightly polished to expose the upper surface of the bump electrode 57 to the outside.

Figure 8E:
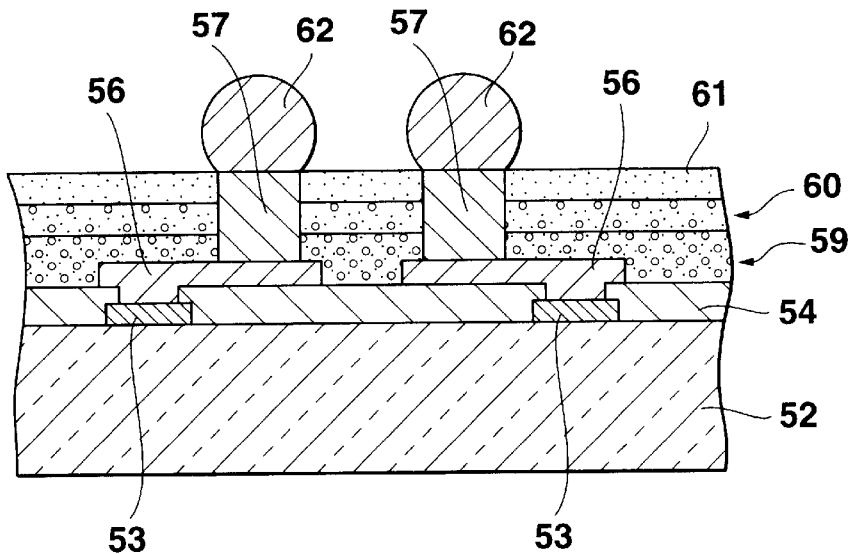

In the next step, the solder bump 62 is formed on the upper surface of the bump electrode 57, as shown in FIG. 8E, followed by cutting the semiconductor substrate 52 in a wafer state into individual semiconductor chips by a dicing process (not shown) so as to obtain the semiconductor device 51 shown in FIG. 7.

In the manufacturing process described above, it is possible to form the lower sealing film 59, the intermediate sealing film 60 and the upper sealing film 61 by coating, followed by simultaneously curing these films 59, 60 and 61. Also, in the second embodiment described above, the silica particles 59b and 60b are equal to each other in the particle diameter. Alternatively, these silica particles 59b and 60b may be made different from each other in the particle diameter. In this case, the particle diameter of the silica particle 59b may be either larger or smaller than that of the silica particle 60b. However, it is necessary to set the volume ratio of the silica particles 59b in the lower sealing film 59 at a value larger than the volume ratio of the silica particles 60b in the intermediate sealing film 60. Further, in the second embodiment, the sealing film 58 is of a three-layer structure. However, the sealing film 58 may be of a multilayer structure including four or more sealing films.

Figure 9:
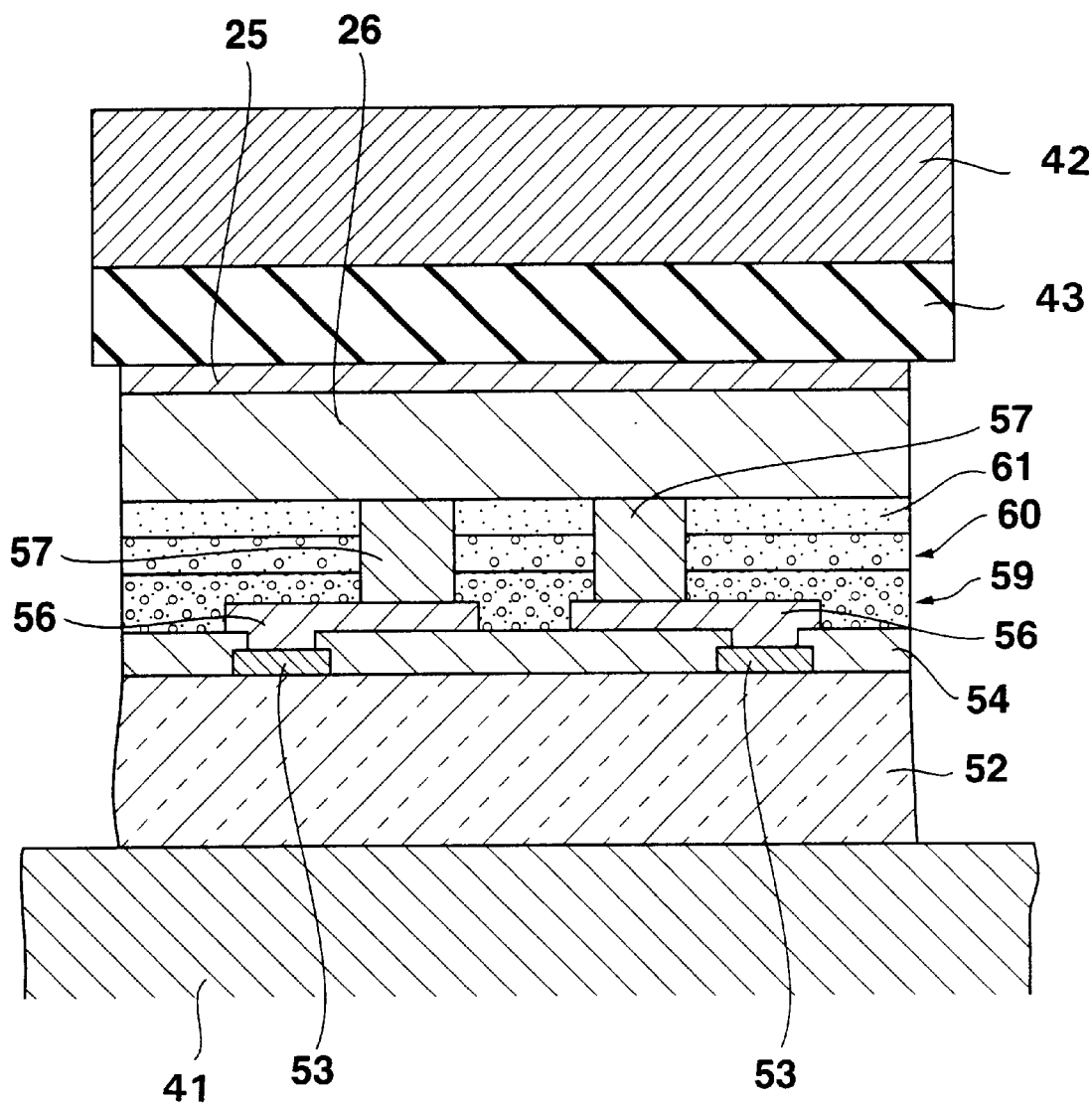
FIG. 9 is a cross sectional view showing the step of pressurizing under heat a sealing film between a hot plate and the stage to permit the bump electrodes to extend through the sealing film in the manufacturing process according to the second embodiment of the present invention.

It is possible to employ the manufacturing method of the first embodiment for manufacturing the semiconductor device 51 of the second embodiment. To be more specific, the protective film 26 and the sealing films 61, 60, 59 are formed on the lower surface of the base film 25, as shown in FIG. 9. These sealing films 61, 60, 59 may be formed by coating of epoxy resins containing silica particles appropriately by a dispenser method, a spin coating method, etc., followed by curing the epoxy resins, or by successively laminating these films prepared in the form of sheets. Then, the silicon substrate 52 is aligned on the upper surface of the stage 41. Also, the lower sealing film 59 of the laminate film is aligned on the upper surfaces of the plural bump electrodes 57. Under this condition, the laminate film is pressurized from the side of the base film 25 by the hot plate 42 having the heat resistant rubber plate 43 mounted to the lower surface thereof. At the same time, the stage 41 and the hot plate 42 are heated to provide a heating temperature of about 150° C. As a result, the protective film 26 and the sealing films 61, 60, 59 are softened appropriately so as to permit the bump electrodes 57 to project through these sealing films. In this case, the upper surfaces of the bump electrodes 57 are prevented from extending to reach the lower surface of the base film 25 by the presence of the protective film 26 even if the total thickness of the three sealing films is smaller than the height of the bump electrode 57.

It follows that the bump electrode 57 is prevented from being collapsed or damaged. In the next step, the hot plate 42, the heat resistant plate 43 and the stage 41 are removed so as to peel off the base film 25 and the protective film 26, thereby obtaining a structure as shown in FIG. 8D. If the upper surface of the bump electrode 57 is covered with the upper sealing film 61 or the bump electrode 57 projects through the upper surface of the upper sealing film 61 after the peeling of the base film 25 and the protective film 26, the upper surface is lightly polished to align the upper surface of the bump electrode 57 with the upper surface of the upper sealing film 61. Then, the solder bump 62 is formed on the upper surface of the bump electrode 57, as shown in FIG. 8E, followed by cutting the semiconductor substrate 52 in a wafer state into individual semiconductor chips by a dicing process (not shown), thereby obtaining individual semiconductor devices 51 each constructed as shown in FIG. 7.

Figure 10:
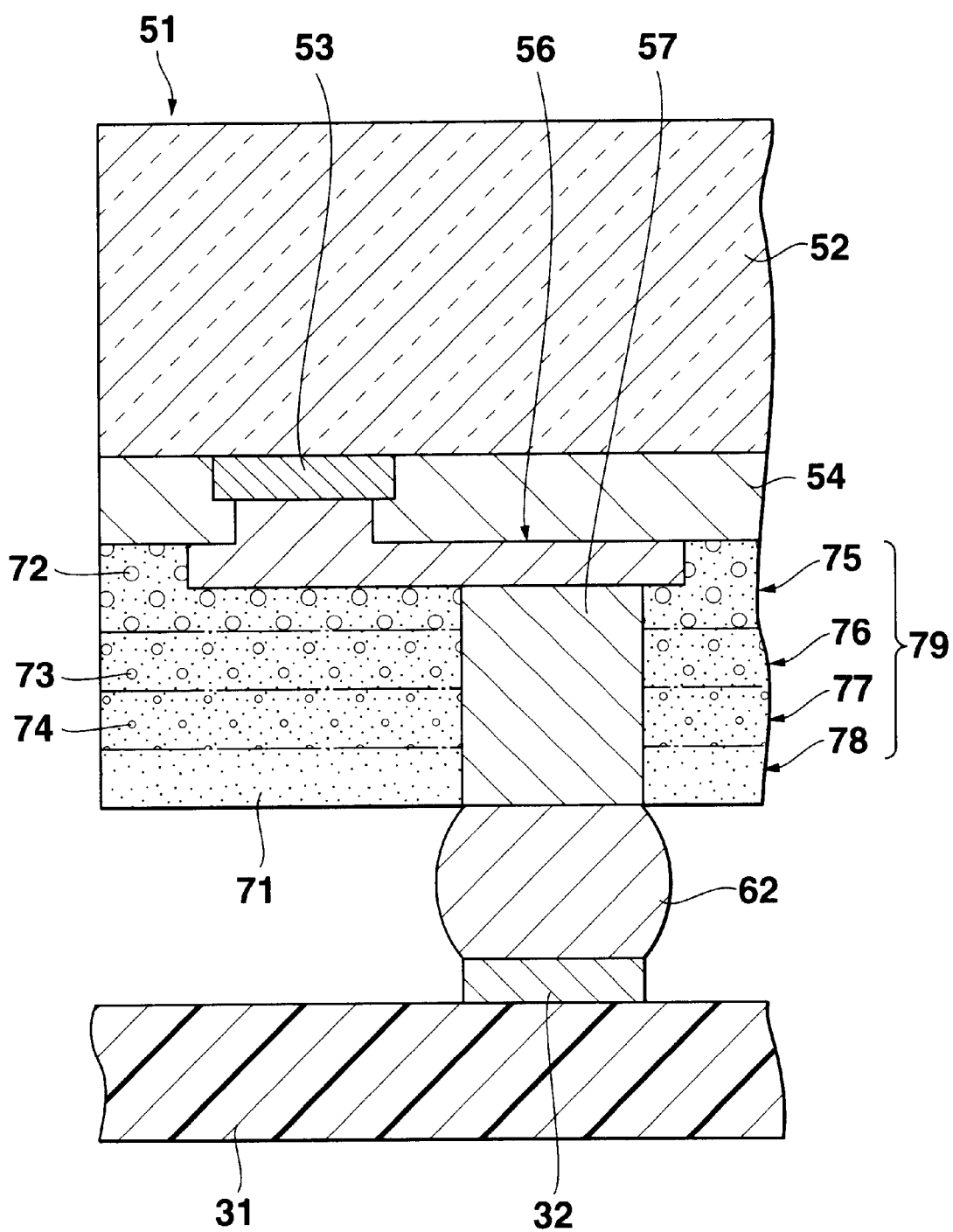
FIG. 10 is a cross sectional view showing a gist portion of a mounting structure in which a semiconductor device according to a third embodiment of the present invention is mounted to another circuit substrate via bump electrodes.
Figure 11A:
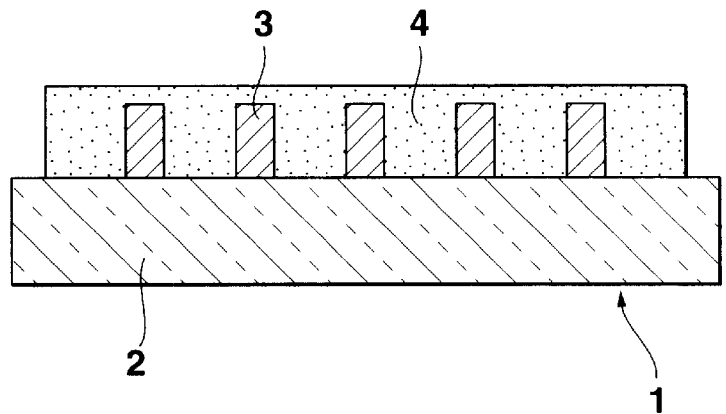
FIGS. 11A and 11B are cross sectional views collectively showing the step of forming bump electrodes of the conventional construction.
Figure 11B:
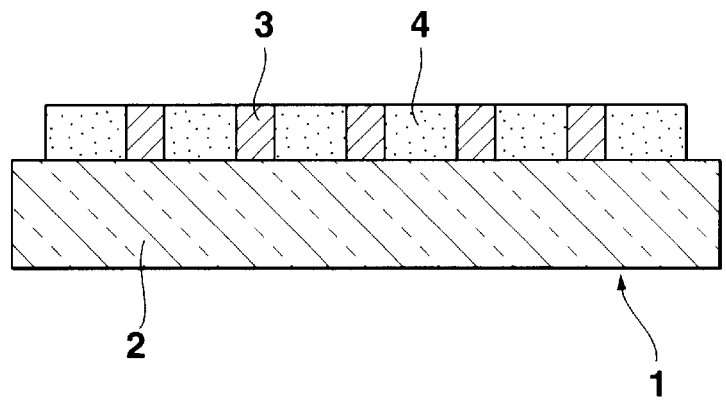
Figure 12:
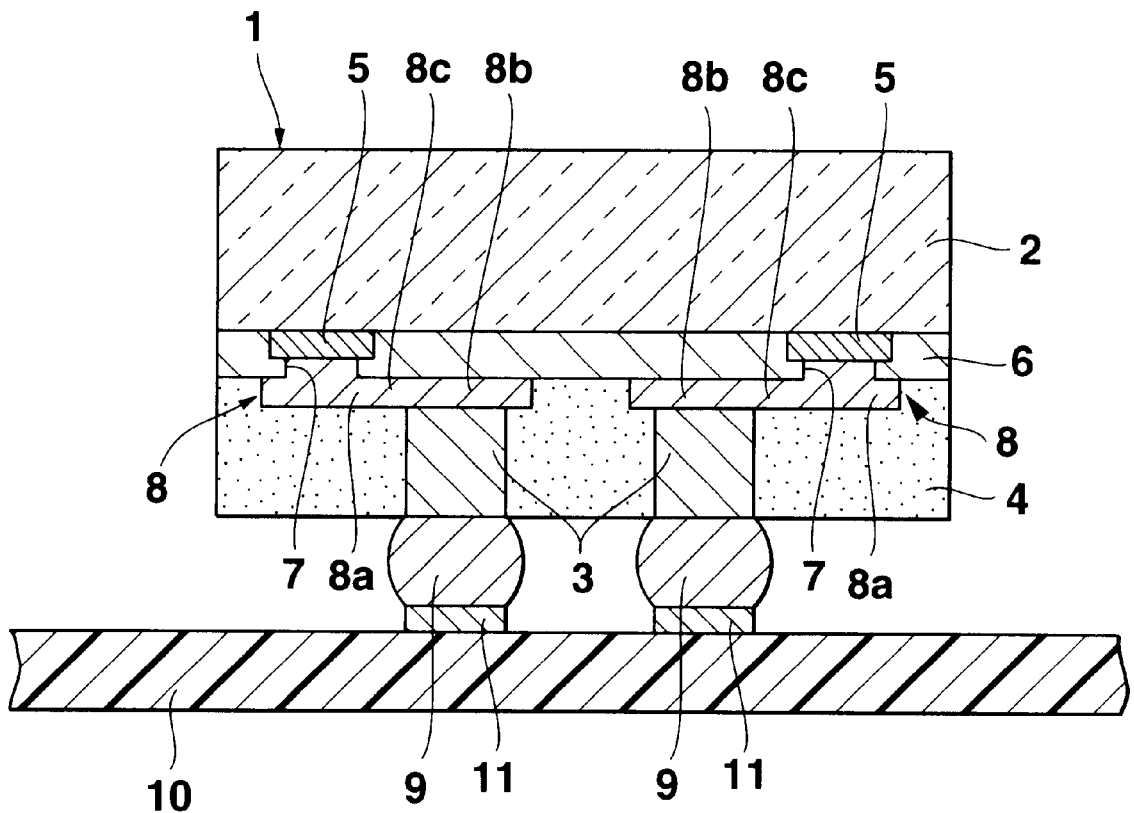
FIG. 12 is a cross sectional view showing a mounting structure in which a semiconductor device having bump electrodes of the conventional construction is mounted to another circuit substrate via bump electrodes.

FIG. 10 is a cross sectional view showing a gist portion of the mounting structure of a semiconductor device according to a third embodiment of the present invention. The reference numerals commonly used in FIGS. 7 and 10 represent the same members of the mounting structure and, thus, explanation of some of these reference numerals is omitted for avoiding the overlapping description. A sealing film 79 included in the semiconductor device of the third embodiment comprises a single resin film prepared by dispersing three kinds of silica particles 72, 73, 74 differing from each other in the particle diameter into an epoxy resin 71. It should be noted, however, that the sealing film 79 can be regarded as being of a four-layer structure comprising a first sealing layer 75 containing mainly silica particles 72 having a large particle diameter, a second sealing layer 76 containing mainly silica particles 73 having an intermediate particle diameter, a third sealing layer 77 containing mainly silica particles of a small particle diameter, and a fourth sealing layer 78 in which any of the silica particles 72, 73, 74 are scarcely contained. These four sealing layers 75, 76, 77, 78 are laminated one upon the other in the order mentioned such that the first sealing layer 75 is in direct contact with the insulating film 54. What should also be noted is that the volume ratios of the silica particles 72, 73, 74 in the epoxy resin 71 are gradually diminished in the order mentioned such that the large silica particles 72 contained mainly in the first sealing layer 75 are contained in the largest volume ratio. Because of the particular construction, the stress derived from the difference in the thermal expansion coefficient between the first sealing layer 75 on the side of the silicon substrate 52 and the silicon substrate 52 can be diminished even if stress derived from the difference in the thermal expansion coefficient between the silicon substrate 52 and the sealing film 79 is generated by the changes in temperature so as to improve the reliability of the bonding, as in the second embodiment.

How to manufacture the semiconductor device 51 of the third embodiment will now be described. In the first step, a structure as shown in, for example, FIG. 8B is prepared. Then, the upper surface of the insulating film 54 except the bump electrodes 57 is coated with the epoxy resin 71 mixed with the three kinds of silica particles 72, 73, 74 by a dispenser method, a spin coating method, etc., followed by rotating the coated epoxy resin 71 for centrifugally moving these silica particles 72, 73, 74 toward the surface of the coated epoxy resin 71. The coated epoxy resin 71 is allowed to stand as it is for a suitable period of time. As a result, these silica particles 72, 73, 74 sink by their own weights into the epoxy resin 71. The sinking depth of these silica particles depend on the diameters of the silica particles. Specifically, the silica particles 72 having the largest diameter sink deepest into the epoxy resin 71, and the silica particles 74 having the smallest diameter sink shallowest into the epoxy resin 71. It follows that formed is a four-layer structure consisting of the first sealing layer 75 in which the silica particles 72 having the large particle diameter are mainly mixed in the epoxy resin 71, the second sealing layer 76 in which the silica particles 73 having the intermediate particle diameter are mainly mixed in the epoxy resin 71, the third sealing layer 77 in which the silica particles 74 having the small particle diameter are mainly mixed in the epoxy resin 71, and the fourth sealing layer 78 in which the silica particles are scarcely mixed in the epoxy resin 71. Then, the epoxy resin 71 is cured, followed by forming the solder bumps 62 on the upper surfaces of the bump electrodes 57. Finally, the silicon substrate 52 in a wafer state is separated into individual semiconductor chips by a dicing step so as to obtain the semiconductor devices 51 each constructed as shown in FIG. 10.

In the third embodiment described above, three kinds of silica particles differing from each other in the particle diameter are used for forming a sealing film of substantially four-layer structure. Alternatively, four or more kinds of silica particles differing from each other in the particle diameter may be used for forming a sealing film of five or more layer structure.

In each of the second and third embodiments described above, the solder bump 62 is formed on the bump electrode 57 of the semiconductor device 51. Alternatively, it is possible to form the solder bump on the connection pad 32 of the wiring substrate 32.

Further, in the embodiments described above, the sealing films 23, 24, 58, 79 are formed on the silicon substrate 21, 52 in a wafer state, followed by dicing the silicon substrate for preparing individual semiconductor chips. Alternatively, it is possible to form the sealing film on the silicon substrate in a chip state. In this case, it is desirable to mount a frame-like structure made of, for example, an epoxy resin around the silicon substrate in a chip state so as to prevent the sealing material from flowing from the upper surface of the silicon substrate in a chip state.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mounting structure comprising a semiconductor device and a circuit substrate, wherein:
   (i) the semiconductor device includes:
      a semiconductor substrate;
      a plurality of columnar electrodes formed on the semiconductor substrate;
      a sealing film which is formed on the semiconductor substrate between adjacent ones of the columnar electrodes, and which has openings through which end faces of the columnar electrodes are exposed; and
      a plurality of solder bumps respectively mounted on the end faces of the columnar electrodes and extending substantially entirely beyond an upper surface of the sealing film; and
   (ii) the circuit substrate includes:
      a plurality of pads;
      wherein the sealing film is made of a single resinous material comprising particles that change a property of the sealing film, and has a lower surface facing the semiconductor substrate and an upper surface facing the circuit substrate;
      wherein the property of the sealing film differs in a thickness direction of the sealing film such that the property has a smaller value in a portion on a side of the lower surface than in a portion on a side of the upper surface, and such that the property increases toward the upper surface from the lower surface;
      wherein the property of the sealing film is similar to a corresponding property of the semiconductor substrate, and includes at least one of a thermal expansion coefficient and an elastic coefficient; and
      wherein the columnar electrodes and the connection pads are respectively connected so that a space presents between the upper surface of the sealing film and the circuit substrate.

2. A mounting structure according to claim 1, wherein:
   said sealing film includes a plurality of laminated layers;
   at least particles for lowering the thermal expansion coefficient are contained in each layer of the sealing film;
   the layers of the sealing film differ from each other in a volume ratio of the particles for lowering the thermal expansion coefficient; and
   the volume ratio of the particles for lowering the thermal expansion coefficient in at least one of the layers of the sealing film close to the semiconductor substrate is larger than the volume ratio of the particles for lowering the thermal expansion coefficient in at least one of the layers of the sealing film remote from the semiconductor substrate.

3. A mounting structure according to claim 2, wherein a height of a top face of the sealing film is equal to or less than a height of a top face of the columnar electrodes, and a thickness of each layer of said sealing film is smaller than the height of the columnar electrodes.

4. A mounting structure according to claim 2, wherein said property of said sealing film in an uppermost one of the layers of said sealing film has a value similar to a corresponding property of said columnar electrodes.

5. A mounting structure according to claim 2, wherein said particles for lowering the thermal expansion coefficient are silica particles.

6. A mounting structure according to claim 1, wherein said sealing film comprises a single resin film mixed with different groups of particles for lowering the thermal expansion coefficient, said groups of particles differing from each other in particle diameter and being distributed such that the thermal expansion coefficient of the sealing film is gradually diminished from a surface side toward the semiconductor substrate.

7. A mounting structure according to claim 6, wherein said particles for lowering the thermal expansion coefficient are silica particles.

8. A mounting structure according to claim 1, wherein said sealing film comprises a single resin film mixed with different groups of particles for lowering the thermal expansion coefficient, said groups of particles differing from each other in particle diameter and being distributed such that a volume ratio of the particles for lowering the thermal expansion coefficient in the resin film is gradually increased from a surface side toward the semiconductor substrate.

9. A mounting structure according to claim 8, wherein said particles for lowering the thermal expansion coefficient are silica particles.

* * * * *